United States Patent [19]

Uota

[11] Patent Number: 4,814,937
[45] Date of Patent: Mar. 21, 1989

[54] DEFECT DETECTOR CIRCUIT FOR INDUCTIVE LOAD DRIVING CIRCUIT

[75] Inventor: Kousaku Uota, Himeji, Japan

[73] Assignee: Mitsubishi Denki Kabushiki Kaisha, Japan

[21] Appl. No.: 59,052

[22] Filed: Jun. 8, 1987

[30] Foreign Application Priority Data

Jun. 9, 1986 [JP] Japan .................... 61-133422

[51] Int. Cl.$^4$ ............................................ H01H 47/32
[52] U.S. Cl. ..................................... 361/154; 361/89; 361/91
[58] Field of Search ............... 340/657, 659, 662, 663; 361/89, 91, 154

[56] References Cited

U.S. PATENT DOCUMENTS

| | | | |
|---|---|---|---|
| 3,868,625 | 2/1975 | Speigner et al. | 60/39.281 |
| 4,040,250 | 8/1977 | Saunders et al. | 60/39.281 |
| 4,345,564 | 8/1982 | Kawamura et al. | 361/154 |
| 4,377,144 | 3/1983 | Takahashi | 361/154 |
| 4,400,756 | 8/1983 | Cave et al. | 361/154 |
| 4,453,194 | 6/1984 | Frankeny et al. | 361/154 |

FOREIGN PATENT DOCUMENTS 60-8760  1/1985  Japan .

*Primary Examiner*—A. D. Pellinen
*Assistant Examiner*—Jeffrey A. Gaffin
*Attorney, Agent, or Firm*—Leydig, Voit & Mayer

[57] ABSTRACT

A defect detector circuit for an inductive load driving circuit which has a surge comparator circuit for comparing a surge generated from an inductive load when the current of the inductive load is interrupted with a reference value on the basis of an output from a surge absorber circuit for absorbing the surge, and a surge time deciding circuit for outputting a defect signal when a time that the surge amount exceeds the reference value does not fall within a set range on the basis of the output from the surge comparator circuit.

6 Claims, 7 Drawing Sheets

DEFECT DETECTOR CIRCUIT FOR INDUCTIVE LOAD DRIVING CIRCUIT

BACKGROUND OF THE INVENTION

This invention relates to a defect detector circuit for an inductive load driving circuit for detecting that a circuit for driving an inductive load such as a coil or the like of an electromagnetic valve becomes defective.

An electromagnetic driving device for converting an electric signal to a mechanical operation has been heretofore used. For example, an electromagnectic fuel injection valve (hereinbelow termed "an electromagnetic valve") which operates on the basis of a command signal from a control circuit to inject fuel has been disclosed as a component of an electronic control type fuel injection device of an internal combustion engine for an automobile in Japanese Patent Application Laid-open No. 59-150935.

FIGS. 8 to 11 indicate a prior-art driving circuit for driving an electromagnetic valve and a defect detector circuit for detecting the defect of the driving circuit as described above. In FIG. 8, reference numeral 1 denotes a calculating circuit which inputs a signal representing various operating states of an internal combustion engine such as an intaken air amount, calculates a fuel injection amount and outputs a command signal $S_1$ for driving an electromagnetic valve. Numeral 2 denotes a switching circuit which receives the command signal $S_1$ from the calculating circuit 1, and conducts or nonconducts a current of a coil 3 of the electromagnetic valve, and which consists of a resister 2a connected at its one end to the output of the calculating circuit 1, and a transistor 2b the base of which is connected to the other end of the resistor 2a, the collector of which is connected to one end of the coil 3, the other end of the coil 3 being connected to a battery voltage $V_B$, and the emitter of which is connected to ground to operate as a switching element. Numeral 4 denotes a surge absorber circuit for absorbing a surge generated when the current of the coil 3 is interrupted. The surge absorber circuit 4 consists of a resistor 4a, connected at one end thereof to the collector of the transistor 2b, and a capacitor 4b connected in series between the other end of the resistor 4a and ground. a driving circuit 5 is composed of the switching circuit 2 and the coil 3. Numeral 6 denotes a defect detector circuit for detecting a defect in the coil 3 and/or the switching circuit 2. The detect detector circuit consists of a resistor 6a connected at one end thereof to the collector of the transistor 2b, a resistor 6b connected at one end thereof to a power source voltage $V_{cc}$, a transistor 6c the base and collector of which are respectively connected to the other ends of the resistors 6a and 6b, and the emitter of which is connected to ground to operate as a switching element, and an exclusive OR circuit 6d which receives a signal $S_3$ from the collector of the transistor 6c and the command signal $S_1$ from the calculating circuit 1, and outputs a defect signal $S_4$. Numeral 7 denotes a defect indicator circuit for indicating a defect on the basis of a defect signal $S_4$ from the defect detector 6. The defect indicator circuit 7 consists of a resistor 7a connected at one end thereof to the output terminal of the exclusive OR circuit 6d, a lamp 7b connected at one end thereof to the battery voltage $V_B$, and a transistor 7c the base and collector of which are respectively connected to the other ends of the resistor 7a and the lamp 7b, and the emitter of which is connected to ground to operate as a switching element.

The operation of the prior-art defect detector circuit constructed as described above will now be described. The operation of the detect detector circuit under normal conditions when no defect exists in the coil 3 and the switching circuit 2 will first be described with reference to FIG. 9. The calculating circuit 1 outputs, as shown in FIG. 9, a command signal $S_1$ comprising a pulse train signal based on fuel injection amount. The transistor 2b of the switching circuit 1 receives the command signal $S_1$ to either turn on or off, thereby to either conduct or nonconduct current through the coil 3, respectively. Specifically, when the command signal $S_1$ is an "H" level (i.e., at the power source voltage Vcc), the transistor 2b is turned on so that a current flows through the coil 3, and the collector potential $S_2$ of the transistor 2b becomes an "L" level (the ground potential). Similarly, when the transistor 6c is turned off, its collector potential $S_3$ becomes the "H" level. Since the potential $S_3$ an the command signal $S_1$ are at the "H" level at the same time, the output $S_4$ of the exclusive OR circuit 6d becomes the "L" level. However, when the command signal $S_1$ returns to the "L" level, namely, when the command signal $S_1$ is switched from the "H" level to the "L" level (the ground potential), the transistor 2b is, in turn, turned off, a causing a surge to be generated in the coil 3 due to the self-induction electromotive force thereof. The surge is absorbed to a certain degree by the surge absorber circuit 4. However, a surge voltage Su as shown in FIG. 9 is generated. Thus, since the surge decreases to wards the battery voltage $V_B$ as a function of time, the potential $S_2$ is actually the battery voltage $V_b$ or higher, while the command signal $S_1$ remains at the "L" level. The transistor 6c is, in turn, turned on, and the collector potential $S_3$ of the transistor 6c becomes the "L" level. Since the potential $S_3$ and the command signal $S_1$ together become the "L" level, the output $S_4$ of the exclusive OR circuit 6d remains at the "L" level. Therefore, since the output $S_4$ of the defect detector 6 is at the "L" level even when the command signal $S_1$ is at the "H" or "L" level, the transistor 7c of the defect indicator circuit 7 is in a normally open state, the lamp 7b is not lit to thereby indicate that there is to defect.

The case where the transistor 2b of the switching circuit 2 becomes defective to indicate a normal-open state (a wire disconnection defect occurs) will be described with reference to FIG. 10. Since the collector potential $S_2$ of the transistor 2b is always at the battery voltage $V_B$ as shown in FIG. 10, the transistor 6c is necessarily always in a turned on state, the collector potential $S_3$ of the transistor 6c is always at the "L" level, whereby the output $S_4$ of the exclusive OR circuit 6d becomes a pulse train signal synchronized with the command signal $S_1$ as shown in FIG. 10. Since the transistor 7c of the defect indicator circuit 7 is turned on so that the lamp 7b is lit when the output $S_4$ is the "H" level, the lamp 7b repeatedly flashes synchronously with the command signal $S_1$ to indicate that there is a defect.

The cases where the transistor 2b of the switching circuit 2 is always in the turned on state (i.e., a shortcircuit defect occurs) and the coil 3 is disconnected to be defective will be described with reference to FIGS. 11. In this case, since the collector potential $S_2$ of the transistor 2b of the switching circuit 2 always indicates the ground potential, the collector potential $S_3$ of the transistors 6c always becomes the "H" level. Thus, the output S₄ of the exclusive OR circuit 6d becomes a pulse train signal which is the command signal S₁ inverted as shown in FIG. 11. Therefore, the lamp 7b flashes similarly to the above-described defect to indicate that there is a defect.

Since the lamp 7b does not light at all when the switching circuit 2 and the coil 3 are not defective and the lamp 7b flashes when there is a defect, a driver can immediately know that the cause of the defect exists in the driving circuit 5 during the time that the internal combustion engine is not operated if the lamp 7b is provided on an instrument panel of an automobile.

According to the above-described prior-art defect detector circuit 6, the wire disconnection and the short-circuit defect of the transistor 2b of the switching circuit 2 can be detected. However, defects such as a partial shortcircuit @shortcircuit between wirings) or the deterioration of the coil 3, a wire disconnection, the shortcircuit or the deterioration of the resistor 4a or the capacitor 4b of the surge absorber circuit 4 can not be detected, since the timing of the opening and the closing the transistor 6c and the output of the exclusive OR circuit 6d are entirely the same as those of the cases of the normal time in which the waveform of the surge voltage Su slightly changes even if the defect occurs. If such a defect occurs, the surge absorbing characteristic of the coil 3 is displaced from the set characteristic, and the response delay time (due to the self-induction electromotive force of the coil) from when the command for interrupting the current of the oil 3 by the command signal S₁ is outputted to when the electromagnetic valve actually stops operating is displaced with respect to the response delay time at the normal time. Thus, even if the time for opening the valve inputted to the calculating circuit 1 is accurate, the actual valve opening time contains an error. Thus, there arises a drawback that an accurate fuel amount is not supplied to the internal combustion engine, whereby the operating performance of the engine is deteriorated.

SUMMARY OF THE INVENTION

This invention has been made in view of the drawbacks described above, and has for its object to provide a defect detector circuit for an inductive load driving circuit capable of detecting a defect in an inductive load driving circuit and hence a surge absorber circuit.

The defect detector circuit for the inductive load driving circuit according to this invention comprises a surge comparator circuit for comparing a surge generated from an inductive load with a reference value on the basis of an output from a surge absorber circuit, and a surge time deciding circuit for outputting a defect signal when a time that the surge amount exceeds the reference value does not fall within a set range on the basis of the output from the surge comparator circuit.

In this invention, the surge is compared with the reference value by the surge comparator circuit, and the surge time deciding circuit outputs a defect signal when the time that the surge exceeds the reference value does not fall within a set range.

DESCRIPTION OF THE PREFERRED EMBODIMENTS

Figure 1:
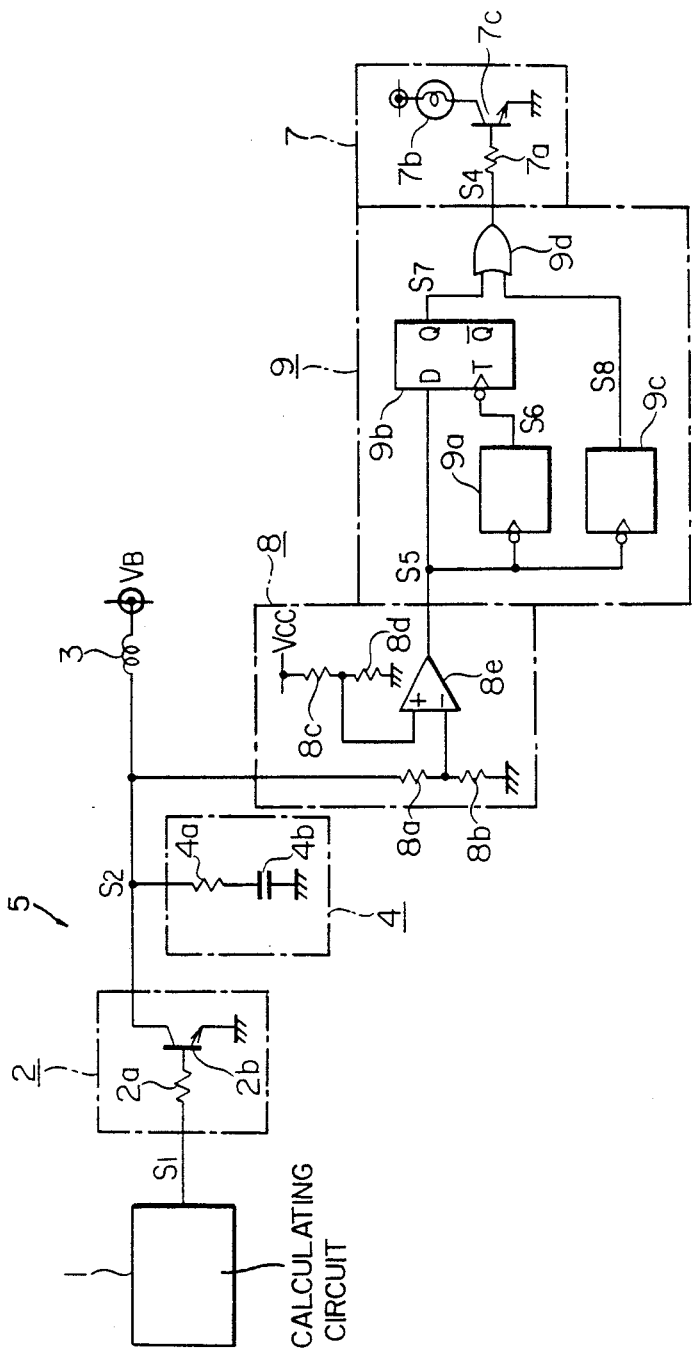
FIG. 1 is a circuit diagram showing an embodiment of a defect detector circuit for an inductive load driving circuit according to the present invention.

Embodiments of this invention will now be described in connection with the accompanying drawings. FIGS. 1 to 4 illustrate an embodiment of a defect detector circuit for an inductive load driving circuit of the invention. In FIG. 1, the same symbols as those in FIG. 1 indicate the same or equivalent parts. Reference numeral 8 denotes a surge comparator circuit for comparing a surge amount with a reference value on the basis of an output from a surge absorber circuit 4. The surge comparator circuit 8 consists of resistors 8a and 8b connected in series between the collector of the transistor 2b of a switching circuit 2 and ground, resistors 8c and 8d connected in series between a power source voltage Vcc and ground, and a comparator 8e the inverting input terminal of which is connected to the connecting point of the resistors 8a and 8b, and the non-inverting input terminal of which is connected to the connecting point of the resistors 8c and 8d. The comparator 8e compares the surge voltage divided by the resistors 8a and 8b with a reference voltage determined by the resistors 8c and 8d, and produces an output signal S₅ which becomes an "L" level when the surge voltage exceeds the reference voltage $V_R$ and which is otherwise an "H" level. Numeral 9 denotes a surge time deciding circuit which outputs a defect signal; S₄ when a time that the surge voltage exceeds the reference voltage $V_r$ does not fall within a set range on the bases of the output S₅ from the surge comparator circuit 8. The surge time deciding circuit 9 consists of a one-shot multivibrator 9a connected at its input terminal to the output terminal of the comparator 8e for producing an output signal S₆ which is set to an "H" level by the falling edge of the signal LS₅ for a predetermined time T₁ and which is otherwise set to an "L" level, a D-flip-flop 9b in which the signal S₅ is applied to its data terminal D, the output signal S₆ is applied to its timing terminal T, for storing the input signal to the data terminal D at the falling edge of the input signal to the timing terminal T, and an output signal S₇ is outputted from its output terminal Q, a watch-dog timer 9c in which the signal S₅ is applied to its input terminal, and which produces an output signal S₈ set to an "L" level while a pulse of a predetermined frequency is input thereto and set to an "H" level when the frequency of the input pulse is the predetermined frequency or lower, and an OR circuit 9d which inputs the output signal S₇ of the D-flip-flop 9b and the signal S₈, calculates the logic sum of both the signals S₇ and S₈, and produces as an output a defect signal S₄.

Figure 2:
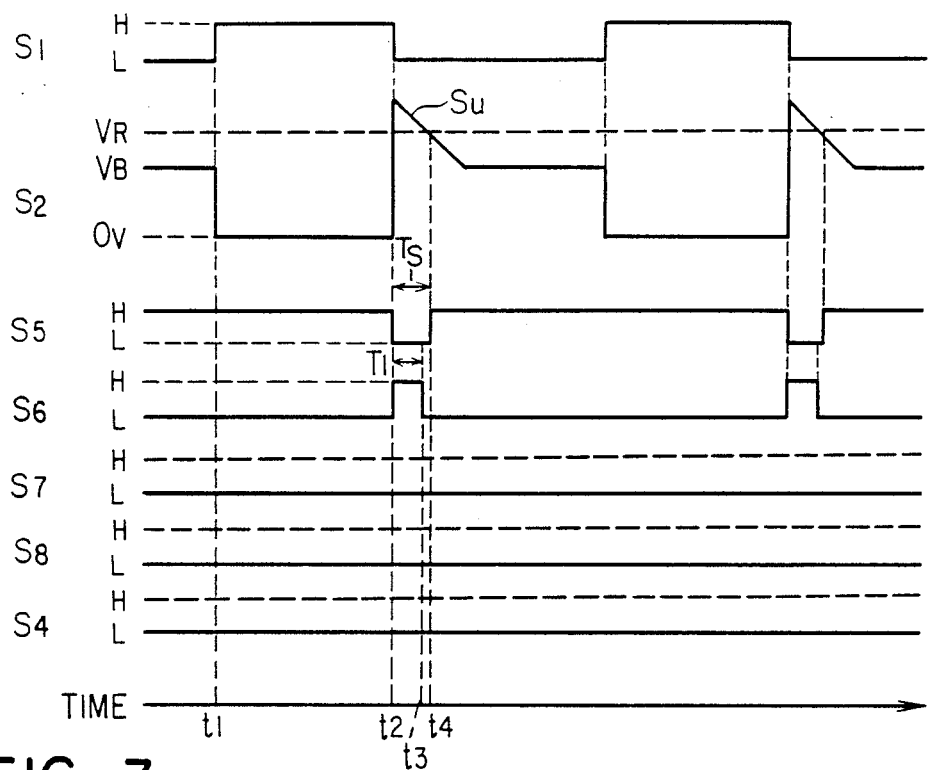
FIG. 2 is a waveform diagram showing the operation during normal time.
Figure 8:
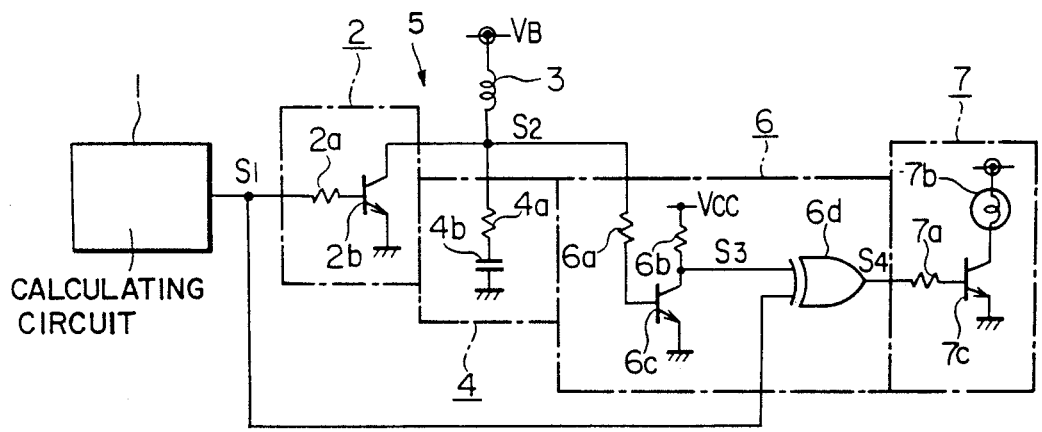
FIG. 8 is a circuit diagram showing a prior-art defect detector circuit for an inductive load driving circuit.
Figure 9:
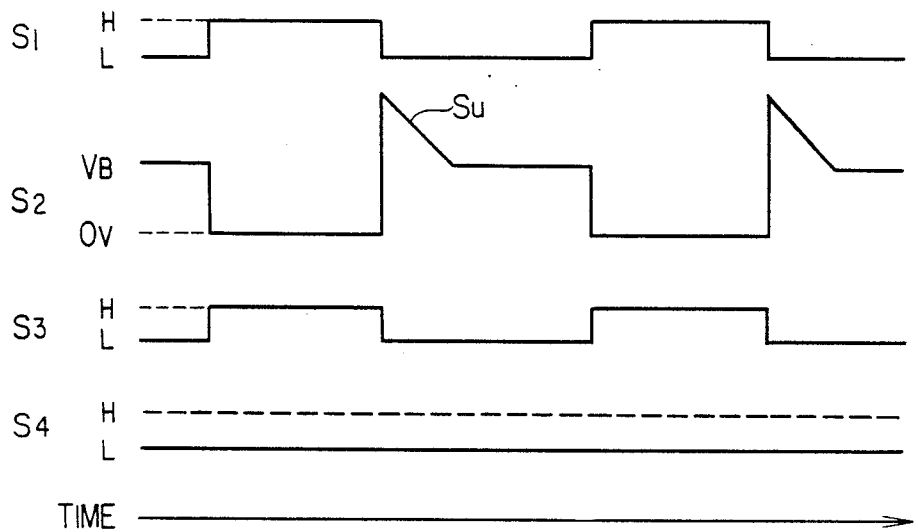
FIG. 9 is a waveform diagram showing the operation during the normal operation time.
Figure 10:
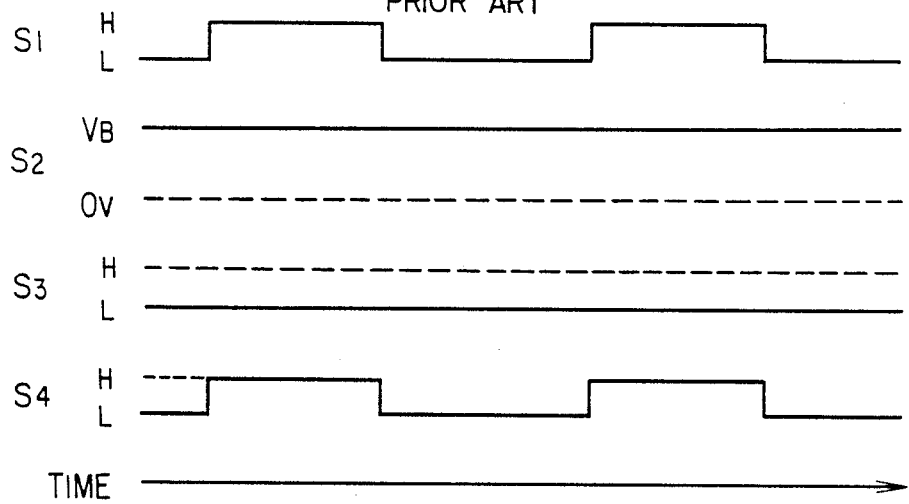
FIGS. 10 and 11 are waveform diagrams showing the operations during defect times.
Figure 11:
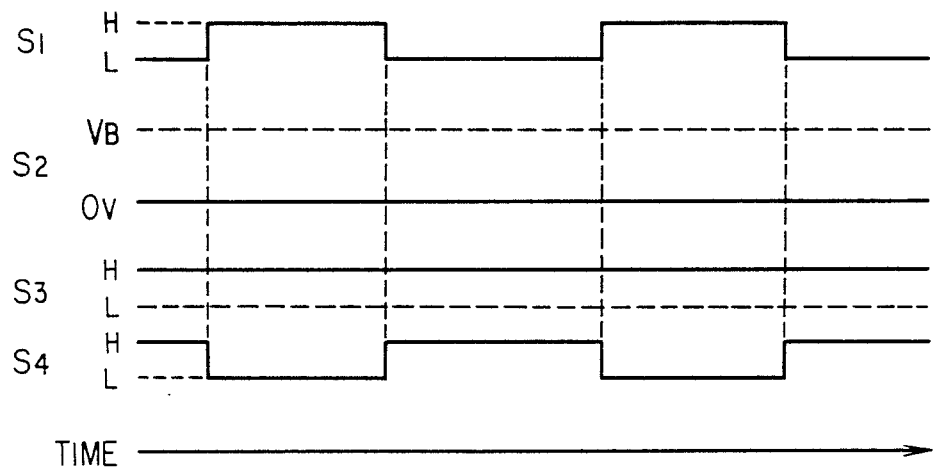

The operation of the embodiment constructed as described above will now be described. The operation of the defect detector circuit during the normal time when not defect exists in the coil 3, the switching circuit 2 or the surge absorber circuit 4 will first be described with reference to FIG. 2. The calculating circuit 1 outputs the command signal $S_1$ comprising a pulse train signal as shown in FIG. 2, similarly to the prior-art defect detector circuit as shown in FIG. 8, and the collector voltage $S_2$ of the transistor $2b$ of the switching circuit 2 shown in FIG. 8 becomes entirely the same as that shown in FIG. 9. The signal $S_2$ of the collector voltage of the transistor $2b$ is compared by the surge comparator 8 with the reference voltage $V_R$, and the output signal $S_5$ of the comparator $8e$ becomes the "L" level during the time that the signal $S_2$ exceeds the reference voltage $V_R$ as shown in FIG. 2. The outputs $S_6$ of the one-shot multivibrator $9a$ is set to the "H" level by the falling edge of the signal $S_5$ during the predetermined time $T_1$, and switches back to the "L" level at a time $t_3$. Accordingly, the "L" level of the signal $S_5$ at the time $t_3$ is stored by the D-flip-flop $9b$, and the signal $S_7$ becomes the "L" level. When the signal $S_7$ is the "L" level, it indicates that the driving circuit 5 is normal and when the signal $S_7$ is the "H" level, it indicates that the driving circuit 5 is defective. To this end, a time $T_s$ (hereinbelow termed "a surge time") that the signal $S_2$ exceeds the reference voltage $V_R$ at normal time is obtained in advance, the time $T_s - \Delta Te$ that is shorter by an allowable error $\Delta Te$ than the surge time $T_s$ by considering the irregularity in the fabrication is set as the value of the predetermined time $T_1$. On the other hand, the watch-dog timer $9c$ is so designed that the output signal S]hd 8 becomes the "L" level when a pulse train signal having the frequency higher than the minimum frequency of the command signal $S_1$ of the calculating circuit 1 is inputted, and the signal $S_8$ normally becomes the "L" level since the signal $S_2$ exceeds the reference voltage $V_R$ so that a pulse train signal of the same frequency as the command signal $S_1$ is generated in the signal $S_5$. Therefore, since the OR circuit $9d$ inputs both the signals $S_7$ and $S_8$ of the "L" level, the OR circuit $9d$ outputs a signal $S_4$ of the "L" level to the defect indicator circuit 7. Thus, the lamp $7b$ is not lit to thereby indicate that the driving circuit 5 is normal.

Figure 3:
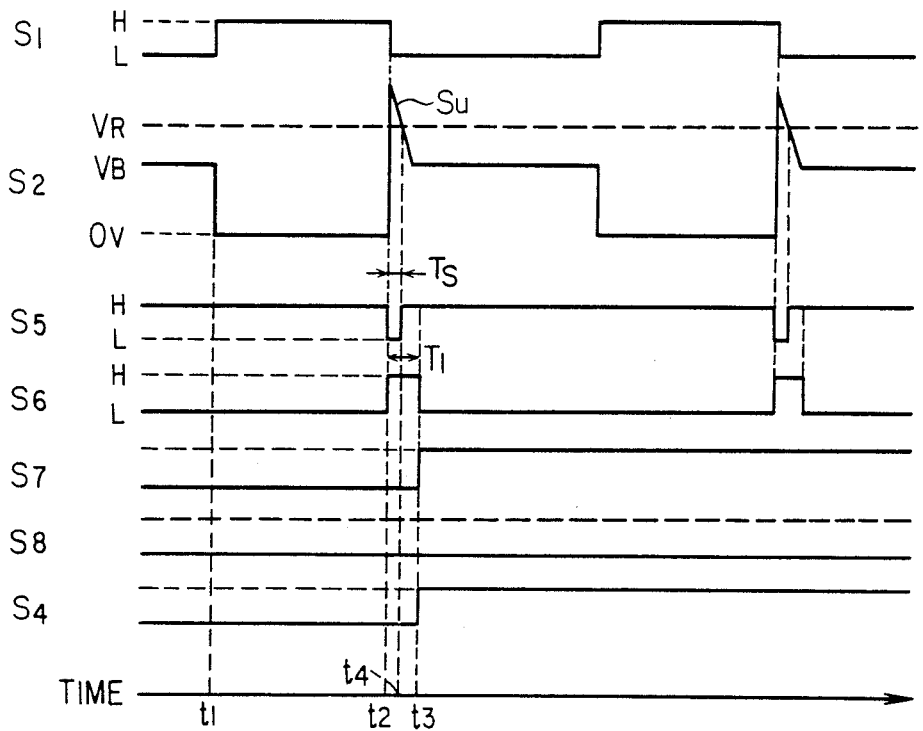
FIG. 3 and 4 are waveform diagrams showing the operation during a defect time.

Then, an example of the case that the driving circuit 5 becomes defective will be described with reference to FIG. 3. FIG. 3 illustrates signal waveforms of this case. When a disconnected defect occurs in the resistor $4a$ or the capacitor $4b$ of the surge absorber 4, the surge voltage Su presented in the signal $S_2$ becomes a large peak voltage as shown in FIG. 3 so that the time that the signal exceeds the reference voltage $V_R$ is shortened. Thus, since the voltage of the signal $S_5$ at the falling time $t_3$ of the output signal $S_6$ of the one-shot multivibrator $9a$ becomes the "H" level, the output signal $S_7$ of the D-flip-flop $9b$ becomes the "H" level. Thus, the output signal $S_4$ of the OR circuit $9d$ becomes the "H" level, and the lamp $7b$ is lit to indicate that there is a defect.

Another example of the case that the driving circuit 5 becomes defective will be described with reference to FIG. 4. When a shortcircuit defect occurs in the resistor $4a$ or the capacitor $4b$ or a shortcircuit between wires occurs in the coil 3, the surge voltage Su presented in the signal $S_2$ becomes a low peak voltage so that the signal does not exceeds the reference voltage $V_R$. Therefore, the signal $S_5$ always becomes the "H" level, an the one-shot multivibrator $9c$ is not excited. Thus, the D-flip-flop $9b$ outputs the signal of the "L" level of the voltage level at normal time stored in the D-flip-flop $9b$ until a defect occurs. On the other hand, since the signal $S_5$ becomes a DC signal as described above, the watch-dog timer $9c$ sets the output signal $S_8$ to the "H" level at a time $t_4$ after a predetermined time from when the last pulse of the signal $S_5$ is applied to the watch-dog timer $9c$. Thus, the output signal $S_4$ of the Or circuit $9d$ becomes the "H" level, and the lamp $7b$ is lit to indicate that there is a defect.

Figure 4:
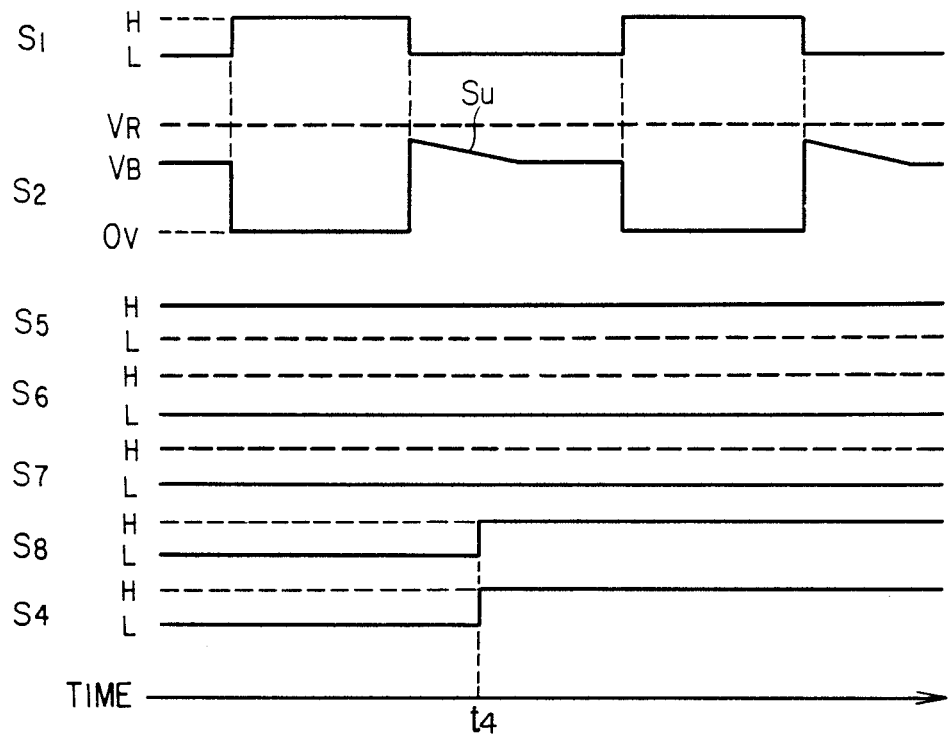

The disconnection and the shortcircuit defects of the transistor $2b$ of the switching circuit 2 and the disconnection defect of the coil 3 which have been described in the prior-art defect detector circuit in FIG. 8 are detected and indicated similarly to the examples of the defect shown in FIG. 4 of the case that the signal $S_5$ always becomes the "H" level since the surge voltage Su is not entirely generated in the signal $S_2$.

In the embodiment as described above, the defect is detected by judging whether the surge time $T_s$ that the surge voltage Su exceeds the reference voltage $V_R$ falls within the set range or not, i.e., is the predetermined time $T_1$ or not, thereby providing excellent advantages that the defect detector circuit can detect not only the defect of the switching circuit 2 or the coil 3 but the defect of the surge absorber circuit 4.

Figure 5:
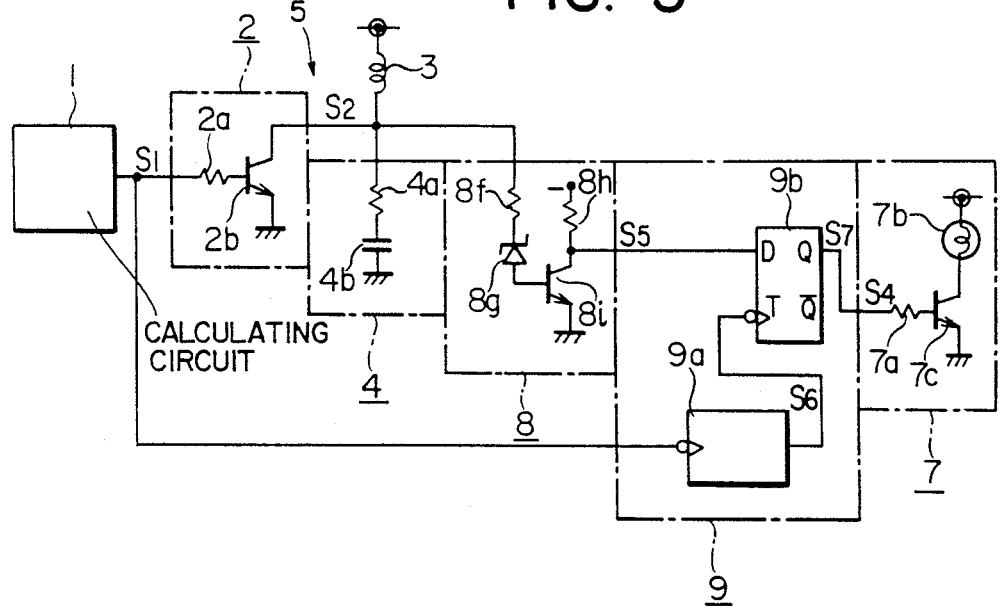
FIG. 5 is a circuit diagram showing another embodiment of a defect detector circuit for an inductive load driving circuit according to the present invention.

FIG. 5 shows another embodiment of a defect detector circuit for an inductive load driving circuit of the invention. In comparison with the embodiment shown in FIG. 1, this embodiment is constructed that in a surge comparator circuit 8 is signal $S_2$ is applied through a resistor $8f$ and a Zener diode $8g$ to the base of a transistor $8i$ connected at its collector to a load resistor $8h$ to close the transistor $8i$ when the surge voltage Su presented in the signal $S_2$ exceeds a reference voltage $V_R$ to become the sum of the Zener voltage $V_z$ of the Zener diode $8g$ an the base-emitter voltage $V_{BE}$ of the transistor $8i$, the watch-dog timer $9c$ and the OR circuit $9d$ are removed, and a command signal $S_1$ is applied to the input of the one-shot multivibrator $9a$.

In the embodiment described above, the one-shot multivibrator $9a$ is excited by the command signal $S_1$ which falls substantially at the same time instead of the fall of the signal $S_5$ to operate in the same manner as the embodiment shown in FIG. 1 and in the same operation as the operations at normal and defect times shown in FIGS. 2 and 3. As to the operation of the defect shown in FIG. 4, the defect signal $S_4$ is outputted by storing the signal $S_5$ of the "H" level due to the defect in the D-flip-flop and outputting the signal $S_5$ since the one-shot multivibrator $9a$ is excited by the command signal $S_1$ woven when the signal $S_5$ becomes a DC signal.

Therefore, this embodiment provides similar advantages to those of the embodiment in FIG. 1, and additionally reduces its components as well as judges the surge time $T_s$ that the surge voltage Su exceeds the reference voltage $V_R$ in synchronization with the command signal $S_1$. Thus, the embodiment provides an advantage of suppressing an erroneous operation of the surge time deciding circuit 9 due to an external surge.

Figure 6:
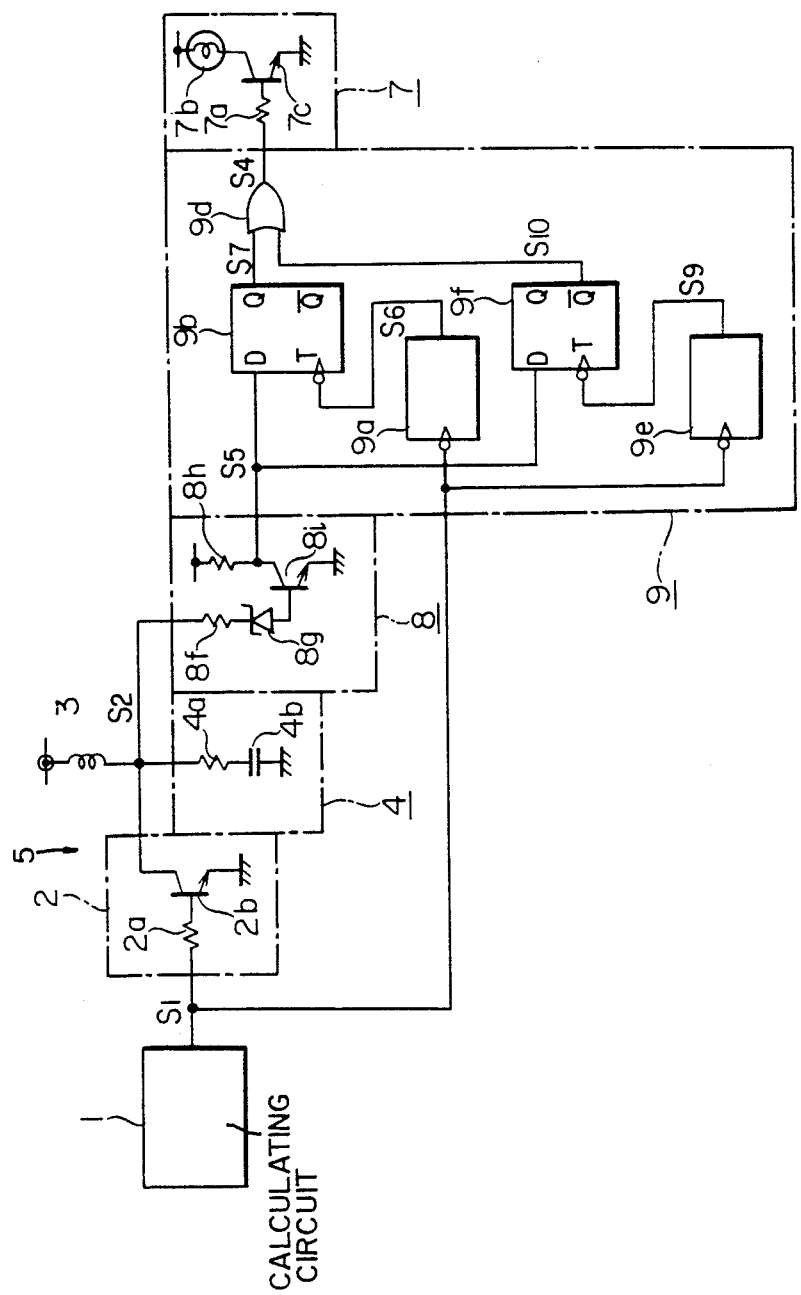
FIG. 6 is a circuit diagram showing still another embodiment of the invention.
Figure 7:
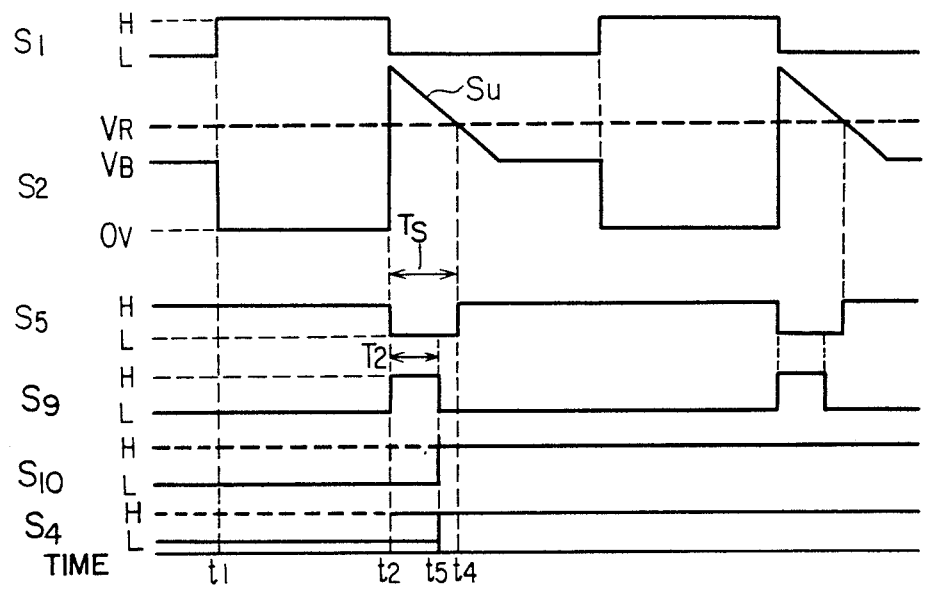
FIG. 7 is a waveform diagram showing the operation during the defect time.

FIGS. 6 and 7 illustrate still another embodiment of a defect detector circuit for an inductive load driving circuit of the invention. In comparison with the embodiment shown in FIG. 5, in order that a surge time deciding circuit 9 judges a defect when a surge time $T_s$ that a surge voltage Su exceeds a reference voltage $V_R$ is a predetermined time $T_2$ or longer, a one-shot multivibrator 9e and a D-flip-flop 9f are further provided, the logic sum of both the signals $S_7$ and $S_{10}$ of the D-flip-flops 9b and 9f are calculated by an OR circuit 9d, and the output of the OR circuit 9d is the output signal $S_4$ of the surge time deciding circuit 9. The output time $T_2$ of the "H" level of the one-shot multivibrator 9e is determined to be the value $T_s + \Delta Te$ by considering the allowable error $\Delta Te$ with respect to the surge time $T_s$ at normal time.

Therefore, this embodiment operates entirely the same manner as that of the embodiment shown in FIG. 5, and additionally detects the case that the number of turns of the coil 3 is more than the normal case due to the malfunction in the fabrication. More specifically, when the inductance of the coil 3 becomes larger than the normal value so that the surge time Ts becomes larger than the normal value as shown in FIG. 7, the "L" level of the signal $S_5$ at a time $t_5$ is stored in the D-flip-flop, and its inverted signal is outputted as the signal $S_{10}$. The OR circuit 9d eventually outputs the "L" level if the surge time $T_s$ satisfies $T_1 < T_2$ and outputs the "H" level signal in case of $T_s < T_1$ or $T_2 < T_s$ to indicate that the circuit is normal.

Therefore, this embodiment described above provides the same advantages as those in the embodiment shown in FIG. 5, and additionally detect the case that the inductance of the coil 3 is larger than the normal value.

In the embodiments described above, the surge amount has been detected on the basis of the surge voltage. However, the invention is not limited to the particular embodiments. For example, the surge amount can be detected on the basis of a surge current.

Further, the surge times deciding circuit 9 can reduce the number of components by utilizing, when a microcomputer is used for the calculating circuit 1, the microcomputer, thereby decreasing the size of the defect detector circuit of the invention.

Moreover, this invention is not limited to the coil for the electromagnetic vale, but may be applied to the general driving circuit for driving an inductive load which generates a surge.

Since this invention is arranged to output a defect signal when the time that the surge exceeds the reference value does to fall within the set range by the surge time deciding circuit by comparing the surge with the reference value by the surge comparator circuit, the invention provides advantages of detecting the defect of the surge absorber circuit.

What is claimed is:

1. A defect detector circuit comprising:
   a surge comparator circuit connected to receive a surge voltage generated from an inductive load and which produces a reference voltage, compares the surge voltage with the reference voltage, and produces a comparator output signal which is in a first logic state during a first time period wherein the surge voltage exceeds the reference voltage, and in a second logic state otherwise;
   a surge time deciding circuit connected to receive the comparator output signal and including:
   (a) a first one-shot multivibrator connected to receive the comparator output signal and to produce a first output pulse for a second time period when the comparator output signal changes from the second logic state to the first logic state, and
   (b) a first flip-flop with a data terminal connected to receive the comparator output signal and a timing terminal connected to receive the first multivibrator output pulse and to store the signal at the data terminal when the first multivibrator output changes from the first logic state to the second logic state,
   wherein the surge time deciding circuit outputs a signal in a first logic state normally and in a second logic state when a defect causes the first time period to be shorter than the second time period; and
   a defect indicator circuit connected to indicate a defect in accordance with the output of the surge time deciding circuit.

2. A defect detector as claimed in claim 1 wherein said surge time deciding circuit further includes:
   (a) a second one-shot multivibrator connected to receive the comparator output signal and to produce a second output pulse for a fourth time period when the comparator output changes form the second logic state to the first logic state;
   (b) a second flip-flop with a data terminal connected to receive the comparator output signal and a timing terminal connected to receive the second multivibrator output pulse and to store the signal at the data terminal when the second multivibrator output changes from the first logic state to the second logic state; and
   (c) a logic circuit connected to receive the stored signals of the first and second flip-flips and to produce the output of the surge time deciding circuit;
   wherein the fourth time period is longer than the second time period, and the surge time deciding circuit outputs a signal in the second logic state when a defect causes the first time period to be longer than the fourth time period.

3. A defect detector as claimed in claim 1 wherein said defect indicator circuit includes a lamp which lights when the output of the surge time deciding circuit is in the second logic state.

4. A defect detector as claimed in claim 1 wherein said surge comparator circuit comprises a voltage divider for providing a reference voltage and a comparator.

5. A defect detector as claimed in claim 1 wherein said surge comparator circuit comprises a zener diode connected to receive the surge voltage.

6. A defect detector as claimed in claim 1 wherein said surge time deciding circuit further includes:
   (a) a watchdog timer with an input terminal connected to the receive the comparator output signal and be reset by a transition of the comparator output signal from the second logic state to the first logic state, and an output terminal; and
   (b) a logic circuit connected to receive the stored signal of the first flip-flop and the output of the watchdog timer and to produce the output of the surge time deciding circuit;
   wherein the watchdog timer produces an output signal when the comparator output signal remains in the second logic state for a predetermined third time period longer than the second time period due to a defect which prevents the comparator output signal from changing from the second logic state to the first logic state.

* * * * *